United States Patent [19]

Zimmerman

[11] Patent Number: 5,635,872
[45] Date of Patent: Jun. 3, 1997

[54] VARIABLE CONTROL OF ELECTRONIC POWER SUPPLIES

[75] Inventor: David G. Zimmerman, Carnation, Wash.

[73] Assignee: Maven Peal Instruments, Inc., Carnation, Wash.

[21] Appl. No.: 559,549

[22] Filed: Nov. 16, 1995

[51] Int. Cl.[6] ................................................. A03G 7/02
[52] U.S. Cl. .................. 330/128; 330/123; 330/202; 330/285; 330/297; 381/61; 381/120
[58] Field of Search ................................ 330/123, 128, 330/202, 285, 297; 381/61, 120, 121

[56] References Cited

U.S. PATENT DOCUMENTS 4,797,633  1/1989  Humphrey ............................. 330/297

*Primary Examiner*—James B. Mullins
*Attorney, Agent, or Firm*—Graham & James LLP/Riddell Williams PS

[57] ABSTRACT

A regulated power supply control system with adjustable operating point and adjustable dynamic behavior for use with electronic power supply circuits, such as musical instrument amplifiers. The control system includes a measurement circuit (20) that generates a measured signal (22) based on an observed signal (18) in an amplifier (10); a sag control circuit (24) that generates a sag signal (32) based on the measured signal (22); a referenced circuit (34) that generates a static reference signal (38); and a regulator (44) that uses the static reference signal (38) and sag signal (32) to generate a regulated power supply output (14) that is used by the amplifier (10). The sag control circuit (24) permits adjustment of the sag signal 32 by a user-operated sag magnitude control (26), sag rate control (28), and sag recovery rate control (30).

18 Claims, 14 Drawing Sheets

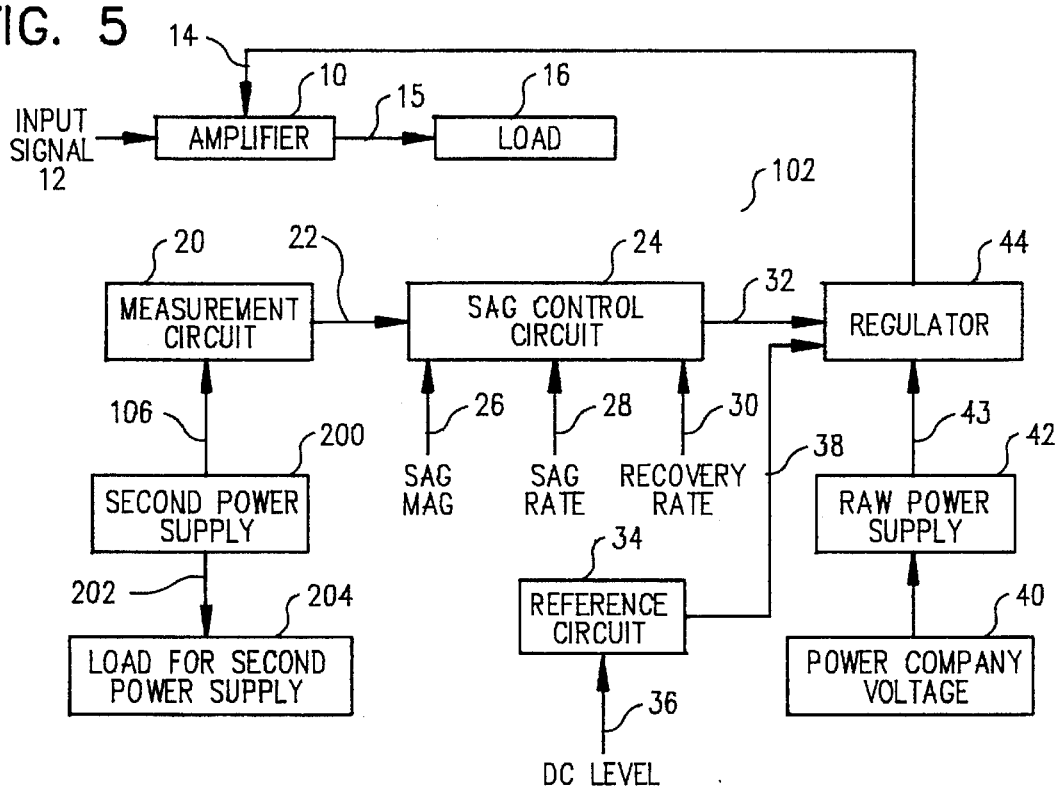
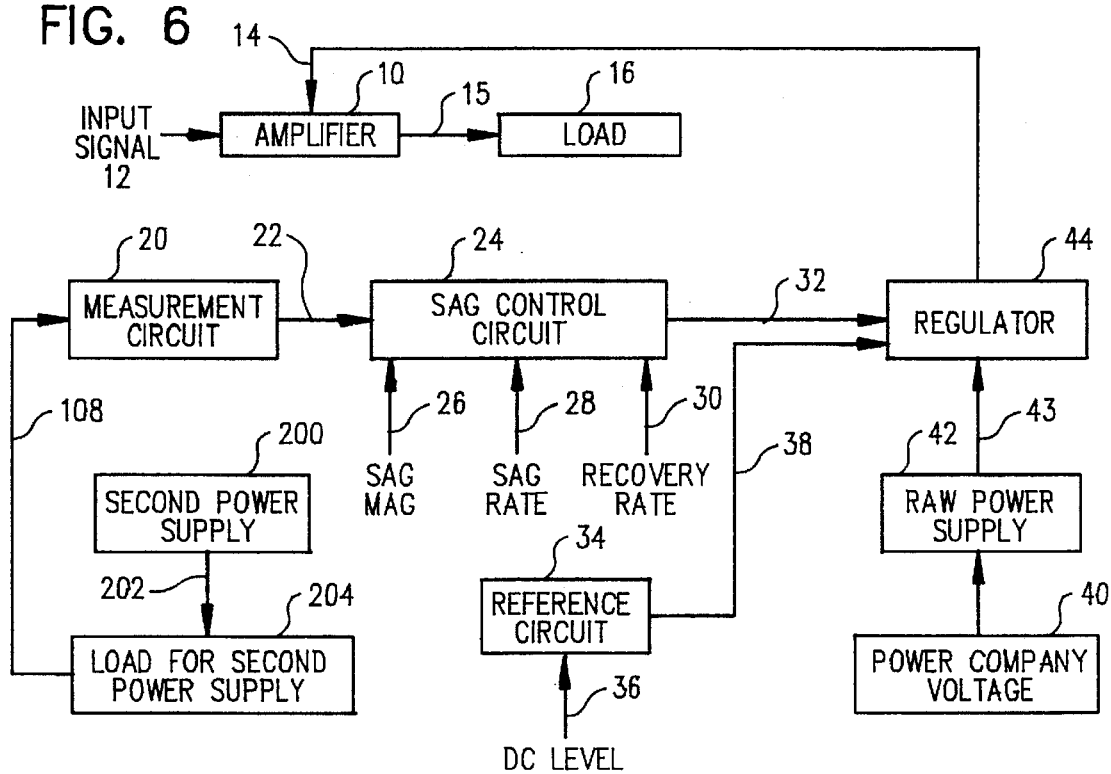

VARIABLE CONTROL OF ELECTRONIC POWER SUPPLIES

TECHNICAL FIELD

The present invention pertains to electronic power supplies, including power supplies used in amplifiers for musical instruments and sound reproduction, and more particularly to the variable control of the static operating point and dynamic behavior of power supplies for electronic amplifiers.

BACKGROUND OF THE INVENTION

Musical instrument amplifiers function to not only increase the power of an input signal presented to the amplifier in order to drive a speaker or other load but also to modify the signal through the introduction of distortion and compression. The usual method of introducing distortion and compression is to configure the amplifier to produce so much gain that one or more of the amplification stages within the amplifier are driven beyond the limits of linear operation. Simply making an amplifier with exceeding amounts of gain, however, ignores the intricate dynamics that occur when an amplifier is driven to and beyond the limit. In particular, the power supply's interaction with the amplifier's operation has a substantial impact on the sound coloration produced by the amplifier.

Audio amplifiers, for both musical instruments and sound reproduction, have power supplies that usually include a transformer having its primary winding connected to AC line voltage supplied by a power company. The transformer's secondary usually consists of three windings. The first winding is used to produce the high positive DC voltage, and it is normally considered the amplifier's main power supply. The second winding, which may either be a completely separate winding or a section of the first winding, is used to create a negative DC bias voltage for the power tubes in the amplifier. The third winding is used to supply power to the tube heaters. The present invention is concerned with the amplifier's main power supply which is referred to herein as the "power supply."

Manufacturers of musical instrument amplifiers have begun to recognize the effect the power supply has on the sound produced by the amplifier. The compression and distortion that is desirable in certain musical instrument amplifiers is caused by a "sag" in the power supply. The sound produced by amplifiers that exhibit large amounts of power supply sag is often described as "warm", "airy" and "forgiving". On the other hand, amplifiers having power supplies that do not sag very much produce sound described as "hard", "edgy" and "harsh".

All power supply circuits exhibit some amount of dynamic impedance that causes power supply sag. When the current drawn from a power supply increases, the dynamic power supply impedance causes the average level of the voltage produced by the power supply to decrease, or sag. This decrease in voltage is due to the increase in current drawn from the supply that causes an IR drop across the power supply impedance. The amount that the power supply's DC level sags for a given amount of current drawn from the supply is dependent on the power supply impedance. This impedance is dependent on the resistance of the transformer's primary and secondary windings, the impedance of rectifiers, and the values of smoothing circuit components.

The time behavior of power supply sag is also dependent on the power supply impedance. The notable aspects of the time behavior of power supply sag are 1) the rate at which the output of the power supply decreases when the current drawn from the power supply increases, i.e. sag rate, and 2) the rate at which the output of the power supply increases back up to its DC level when the current drawn from the power supply decreases, i.e. recovery rate. Vacuum tube rectifiers exhibit a relatively large dynamic impedance when compared to solid state rectifiers. Replacing modern solid state rectifiers with old style vacuum tube rectifiers has become commonplace when the compressive sound of 1950's and 1960's style amplifiers is desired. The large vacuum tube rectifier impedance causes the decrease in power supply voltage to become quite pronounced when a large amount of current is drawn from the supply. The average level of the power supply voltage can decrease by 20% or more in some cases. This large decrease limits the maximum amount of power an amplifier can deliver, thereby compressing the output signal and causing distortion in the amplifier's output.

The disadvantages of vacuum tube rectifiers include size, expense, frequent need of replacement, and the need for separate high current filament supplies that dissipate high amounts of heat. Additionally, the current capacity of most available vacuum tube rectifiers is so limited that some high power amplifiers require two or more of these rectifiers. To avoid these problems with vacuum tube rectifiers, some manufacturers include a large resistor in series with the power supply output to increase the power supply's dynamic impedance while still utilizing solid state rectifiers. Another method of increasing the power supply's dynamic impedance while using solid state rectifiers has been to wind the secondary of the power supply transformer with very high resistance wire, effectively placing a large resistor in series with the power supply output.

While increasing the dynamic impedance of a solid state rectified power supply enables an amplifier to produce sonic characteristics similar to that of older amplifiers, high power supply impedance greatly reduces the maximum amount of power that an amplifier can deliver to a load, (especially at the low end of the audio spectrum). To avoid this problem, some manufacturers include two sets of power supply rectifiers, vacuum tube and solid state. The musician can then switch between these two sets of rectifiers to make the amplifier sound two different ways. In power supplies utilizing solid state rectifiers with a fixed resistor in the power supply, some amplifiers allow the resistor to be switched in and out of the circuit. Both the multiple rectifier and the fixed power supply resistor approaches only allow the musician to choose between two amounts of power supply sag for a given amount of current drawn from the power supply. That is, the sag magnitude is not completely adjustable. Using a very high power variable resistor in conjunction with solid state rectifiers would increase the power supply circuit's flexibility, but at very high cost, as well as increased weight and space requirements. Consequently, this solution is not practical. An interesting application of power supply sag is shown in U.S. Pat. No. 4,713,624 issued Dec. 15, 1987 to Smith. The main idea behind this patent is to increase the effective power supply resistance of the screen grid power supply in an amplifier using pentode power tubes in a push-pull configuration. The plate current in a pentode is at least 10 times more dependent on the screen voltage than on the plate voltage. Therefore, if the screen voltage decreases substantially due to power supply sag, the maximum plate current, and therefore load current, that the amplifier can produce is also decreased. This decrease in maximum load current compresses the output signal and introduces distortion in the amplifier's output. Additionally, increased screen power supply impedance also decreases the sag rate and decreases the recovery rate. These rates determine the time behavior of the power supply sag and are very critical in the overall sound produced by an amplifier. While U.S. Pat. No. 4,713,624 recognizes the important role that power supply impedance plays in the overall behavior and sound of an amplifier, the patent does not allow for the amount of power supply sag to be adjustable. Additionally, the power supply sag rate and recovery rate in the Smith patent, or for that matter any other power supply configuration, are not adjustable.

In many sound reproduction amplifiers (e.g. home stereos) the power supplies are regulated. Regulated power supplies offer many benefits over unregulated power supplies. The first benefit of a regulated power supply is that power supply ripple is reduced. Power supply ripple can induce unwanted hum in the amplifier's output. The second advantage of regulated power supplies is that the voltage produced by the supply is independent of the voltage delivered by the power company (within limits). The operating point of the various devices within an amplifier is directly dependent on the DC level produced by the amplifier's power supply. If these operating points change, the amplifier's sound can change. Having a consistent power supply is very important in musical instrument amplifiers since repeatable amplifier behavior is desired by musicians as they travel to various locations for live performances.

The third advantage of regulated power supplies in most applications is that the dynamic impedance of these supplies is basically zero. That is, the voltage produced by the supply is independent of the current delivered by the power supply, i.e. no sag. This last property of regulated power supplies is a disadvantage when the power supply is used with a musical instrument amplifier. Therefore regulated power supplies are generally not used with musical instrument amplifiers, as a matter of fact, many home stereo amplifiers, especially tube types, do not use regulated power supplies because the manufacturer feels that unregulated supplies add a "warmth" to the amplifier's sound.

An important modification of unregulated power supplies used in musical instruments has come from some enterprising musicians. These musicians have found that by varying the AC power delivered to an amplifier, they can dramatically change the amplifier's sound. This change in AC power is accomplished by plugging the amplifier into a variable transformer, which is then plugged into the wall outlet. By altering the AC voltage delivered to an amplifier, the basic sound and maximum signal level produced by the amplifier is changed. This alteration has been embraced in an amplifier design in U.S. Pat. No. 5,091,700 issued Feb. 25, 1992 to Smith where multiple taps on the primary of the power transformer are provided in order to produce various levels of power supply DC output voltage.

The drawback of both the variable transformer as well as the multiple tapped primary concepts is that the voltages present on the other secondary windings are being modified. Altering the negative bias voltage of the output tubes can lead to crossover distortion, or dramatically increased DC tube current. Crossover distortion is very unpleasant and not desired, while increased DC tube current can lead to premature tube failure.

To eliminate the problem of altering the negative bias and heater supplies with a multiple tapped transformer primary, these two voltages could be produced from a second transformer that does not have a multiple tapped primary. However, the use of a second transformer would dramatically increase the cost and space requirements of these supplies. Additionally, the multiple tapped primary does not allow the DC voltage produced by a power supply to be continuously variable, and adding taps to a transformer increases the cost of the transformer.

In summary, all known power supply circuits for musical instrument and sound reproduction amplifiers suffer from one or more of the following disadvantages:

(a) The amount of power supply sag due to a given amount of current drawn from the supply is fixed at a single or at most two values.

(b) The time behavior of the power supply sag is not adjustable by the musician.

(c) The amount of power supply sag and time behavior of the power supply sag are interrelated.

(d) In unregulated power supplies, the average voltage produced by the supply is dependent on the voltage delivered by the power company.

(e) In unregulated power supplies, hum is present in the power supply output which can produce hum in the amplifier output.

(f) In unregulated power supplies, the DC level of the voltage produced by the supply is not adjustable without modifying the negative bias and heater supplies unless a second transformer is used.

(g) In unregulated power supplies, the DC level of the voltage produced by the supply is not continuously adjustable unless a variable transformer is used.

(h) In regulated power supplies, the voltage produced by the supply does not decrease with increased supply current (i.e. the output voltage does not sag).

SUMMARY OF THE INVENTION

In accordance with the present invention, an electronic power supply controlling circuit for a power supply in an electronic circuit is provided. The circuit has at least one power supply and the circuit is adapted to receive a raw power supply current from the power supply and an input signal from an input signal source, and is further configured to supply a corresponding amplified output signal to a load. The control circuit comprises a measuring circuit for measuring an observed signal and generating a static signal and response thereto; a sag control circuit for receiving the measured signal and generating a sag control signal in response to the measured signal; a reference circuit for generating a static signal; and means for regulating the power supply, the regulating means receiving the sag control signal, the static signal, and a power supply current from a raw (unregulated) power supply, and generating a regulated DC current power supply for the amplifier in response to the sag control signal and the static signal, whereby as the sag control signal to the amplifier increases, the regulating means decreases the maximum power available to the amplifier, thereby producing increased distortion and compression in the output signal.

In accordance with another aspect of the present invention, the sag control circuit includes adjustments for controlling either one or all of the maximum value of the sag control signal, the rate of increase of the sag control signal, and the rate of decrease of the sag control signal in response to the measured signal.

In accordance with yet another aspect of the present invention, the observed signal is either one of the output signal from the amplifier, the DC power supply current received in the amplifier, the raw power supply current drawn by the power supply, a second power supply current generated by a second power supply for a second load in the electronic amplifier circuit, or a second load signal generated by a second load that is powered by a second power supply in the power amplifier circuit.

In accordance with a further embodiment of the present invention, a method for controlling an electronic power supply in an electronic amplifier circuit having an amplifier and at least one power supply is provided. The amplifier is adapted to receive a power signal from at least one power supply and an input signal from an input signal source, and is further configured to generate an amplified output signal. The method comprises the steps of monitoring an observed signal in the electronic amplifier circuit and generating a measured signal and response thereto; generating a sag control signal in response to the measured signal; generating a static reference signal; and regulating the power supply signal and response to the sag control signal and the static reference signal such that as the input signal to the amplifier increases, the maximum power available to the amplifier decreases, thereby producing increased distortion and compression in the output signal.

In accordance with another aspect of the present invention, the step of generating a static reference signal includes monitoring a direct current signal upon which the static reference signal is based. The direct current signal may be varied by the user.

In accordance with still yet another aspect of the present invention, the step of generating a sag control signal further includes adjustably controlling one or more of the maximum magnitude of the sag control signal, the rate of change of the sag control signal as it either increases, decreases, or both in response to the measured signal.

In accordance with yet another aspect of the present invention, the step of monitoring an observed signal further comprises monitoring one or more of the output signal from the amplifier, the power supply current delivered to the amplifier, a raw power supply current drawn by the power supply, a second power supply current generated by a second power supply for a second load in the power amplifier circuit, or a second load signal generated by a second load that is powered by a second power supply in the power amplifier circuit.

As will be readily appreciated from the foregoing, the present invention provides a power supply that includes some of the features of regulated, as well as unregulated power supplies, while providing user control of the power supply's dynamic behavior and the DC level of the power supply. The advantages include:

(a) Independence of the power supply output voltage from fluctuations in the power company line voltage.
(b) Elimination of ripple from the output of the power supply.
(c) User controllable DC power supply voltage.
(d) User controllable power supply sag magnitude.
(e) User controllable rate of power supply sag.
(f) User controllable rate of power supply recovery.
(g) A decoupling of the DC level, power supply sag magnitude, power supply sag rate and power supply recovery rate controls.

BRIEF DESCRIPTION OF THE DRAWINGS

The foregoing and other features and advantages of the present invention will be more readily appreciated as the same becomes better understood from the detailed description of the invention when considered in conjunction with the following drawings, wherein:

FIG. 5 is another alternative embodiment of a power supply control circuit of FIG. 1;

FIG. 6 is yet another alternative embodiment of the power supply control circuit shown in FIG. 1;

DETAILED DESCRIPTION OF THE INVENTION

Figure 1:
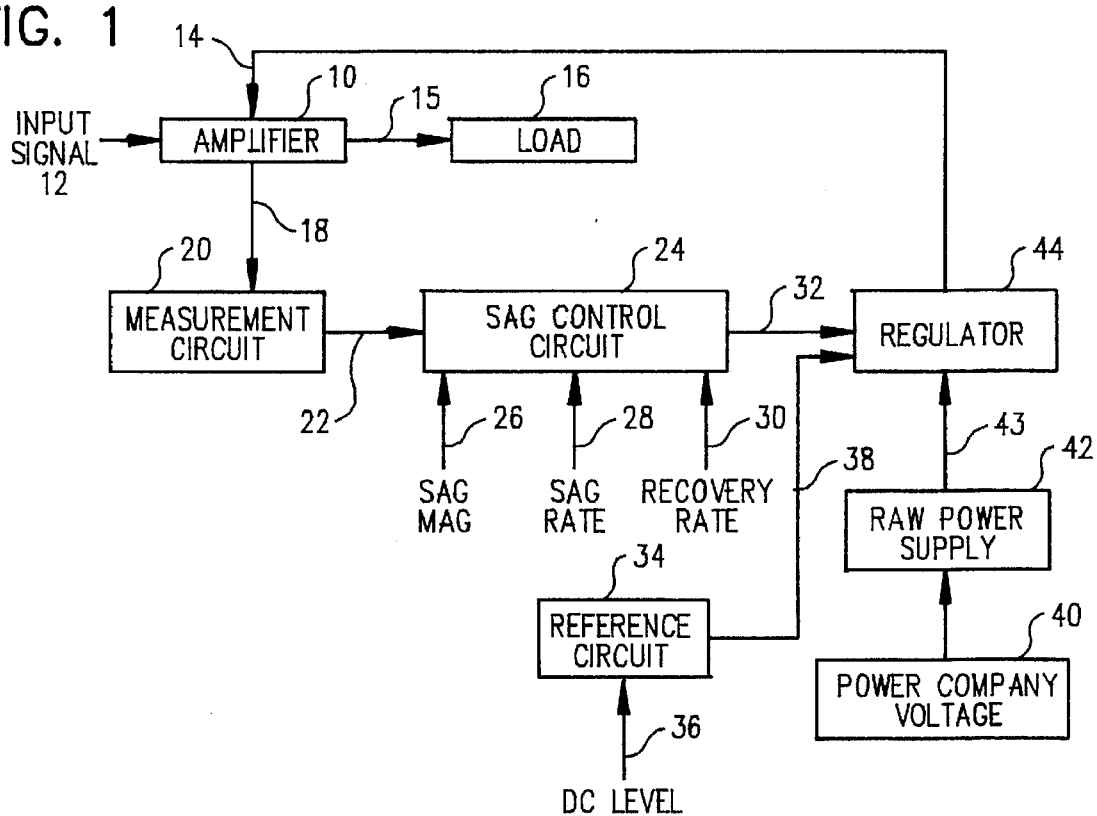
FIG. 1 is a simplified block diagram of a power supply control circuit formed in accordance with the present invention.

FIG. 1 is a block diagram of a representative embodiment of a control system for an electronic circuit formed in accordance with the present invention. The circuit includes an amplifier 10 adapted to receive an input signal 12 from an input signal source (not shown), a power supply input 14 from power supply 44, and to output an output signal 15 to a load 16. The amplifier 10 may have any of a vast number of amplifier configurations. The function of the amplifier 10 is to increase the power of the input signal 12 in order to drive the amplifier load 16. Since no amplifier is perfect, the amplifier 10 also adds distortion and compression to the signal 15 sent to the load 16. In this embodiment, the voltage across or current through a particular device within the amplifier 10 is an observed signal 18 measured by a measurement circuit 20. The output of measurement circuit 20 is a measured signal 22, which can be the actual device current or voltage observed within the amplifier 10. Ideally, the measurement circuit 20 produces a normalized function of the observed device current. For example, the measured signal output 22 of the measurement circuit 20 could be the peak, average or RMS value of the observed voltage or current.

A sag control circuit 24 generates a sag signal 32 based on the measured signal 22. The maximum magnitude of the sag signal 32 is dependent on a user-adjustable sag magnitude control 26. The rate at which the sag signal 32 changes from zero to its maximum magnitude when a measured signal 22 is present is dependent on the user adjustable sag rate control 28. The rate at which the sag signal 32 changes from its maximum magnitude back to zero when the measured signal 22 returns to zero is dependent on the user adjustable recovery rate control 30.

A reference circuit 34 generates a static reference signal 38. The value of this reference signal is not dependent on the voltage provided by the power company or on the amplifier input signal 12. The magnitude of the static reference signal 38 may be dependent on user adjustable DC level control 36.

The static reference signal 38 and sag signal 32 are then used by a regulator 44 to generate a power supply output 14, which is used by the amplifier 10. The regulator 44 may consist of multiple regulator circuits for providing all of the various power requirements of the amplifier 10. For example, many solid state amplifiers require a positive and a negative power supply voltage to operate. The DC level of the regulator 44 output(s) is dependent on the value of the static reference signal 38. The instantaneous value of the regulator 44 output(s) is dependent on both the sag signal 32 and the static reference signal 38. When the sag signal 32 increases from zero, the magnitude of the output will decrease from the DC level to a lower level, thus tracking the sag signal 32.

There are numerous possible regulator configurations. However, ideally the power company voltage 40 is first passed through a simple raw power supply 42. The output 43 of the raw power supply 42 is then used as the power input to the regulator 44 in order to produce its final output(s).

As an illustration of the present embodiment's behavior, assume that the measured signal 22 is the positive peak value of the observed signal 18. Also assume that the input signal 12 has been zero for a long period and then a constant amplitude input signal 12 is applied to the amplifier 10 for a period and then the input signal 12 returns to zero. When the input signal 12 changes from zero to its new varying state, the measured signal 22 produced by measurement circuit 20 will change from zero to the peak value of the observed signal 18. Since the measured signal 22 has increased, the sag control circuit 24 will start to increase the sag signal 32. The rate at which the sag signal 32 increases is dependent on the setting of the user adjustable sag rate control 28. After a period of time dependent on the user adjustable sag rate control 32, the sag signal 32 will increase to its maximum value and remain at this value until the measured signal 22 changes. The magnitude of this maximum value is dependent on the user adjustable sag magnitude control 26. When the input signal 12 returns to zero, the measured signal 22 also returns to zero. As this occurs, the sag control circuit 24 will begin to decrease the sag signal 32 back to zero at a rate that is dependent on the user adjustable recovery rate control 30.

Continuing with this example, when the sag signal 32 is zero, the regulator 44 is producing DC output(s) that are dependent on the static reference signal 38. The magnitude of the static reference signal 38, and therefore the DC output of the regulator 44, is dependent on the user adjustable DC level control 36. As the sag signal 32 begins to increase from zero to its maximum, the regulator 44 output(s) will track the sag control signal 32 in an inverse relationship. That is, as the sag signal 32 increases, the magnitude of the regulator 44 output(s) will decrease. Conversely as the sag signal 32 returns to zero, the output(s) will return to their static or DC values.

The net result of this described behavior is that as the input signal 12 to the amplifier 10 increases, the maximum power available to the amplifier 10 decreases due to a decrease in the power supply input 14 (regulator output). This decrease in available power causes increased distortion and compression in the signal that appears at the amplifier load 16.

Figure 2:
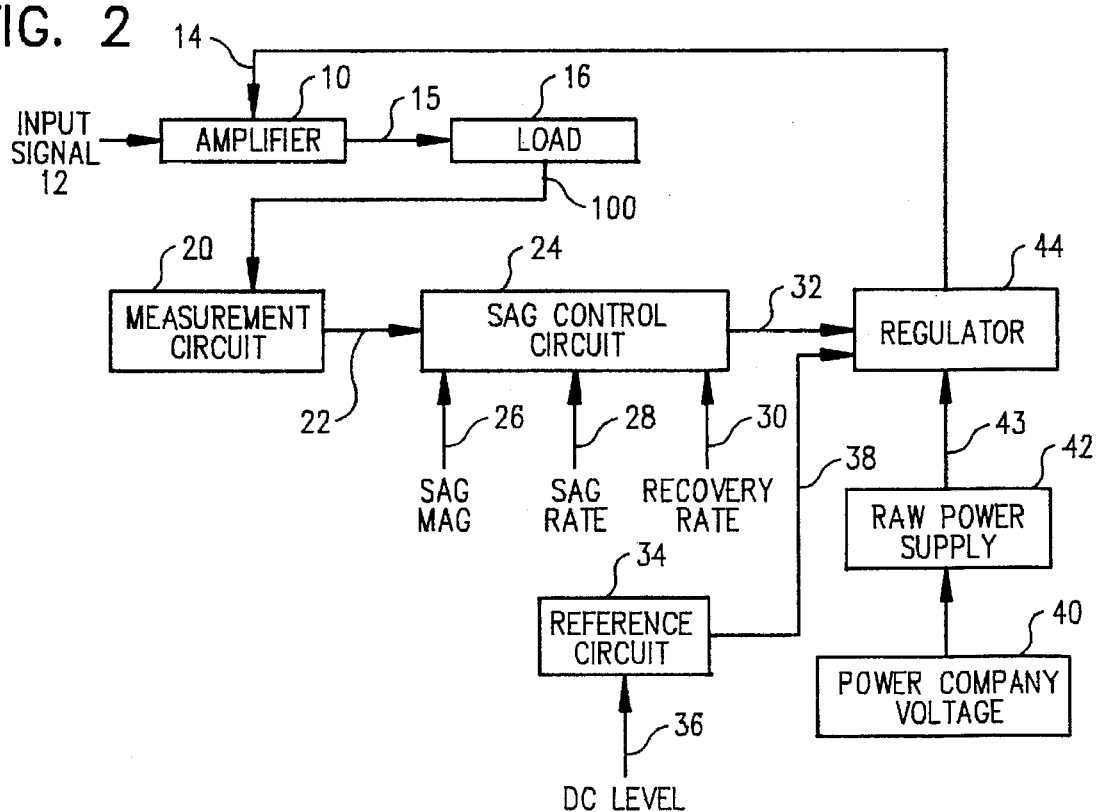
FIG. 2 is an alternative embodiment of the power supply control circuit of FIG. 1.

FIG. 2 depicts a block diagram of a another embodiment of the present invention. In this embodiment, the observed signal 100 is a current or voltage in the amplifier load 16 of the amplifier 10. Other than the different observed signal 100, this embodiment functions in the same manner as the embodiment described in detail in FIG. 1 above.

Figure 3:
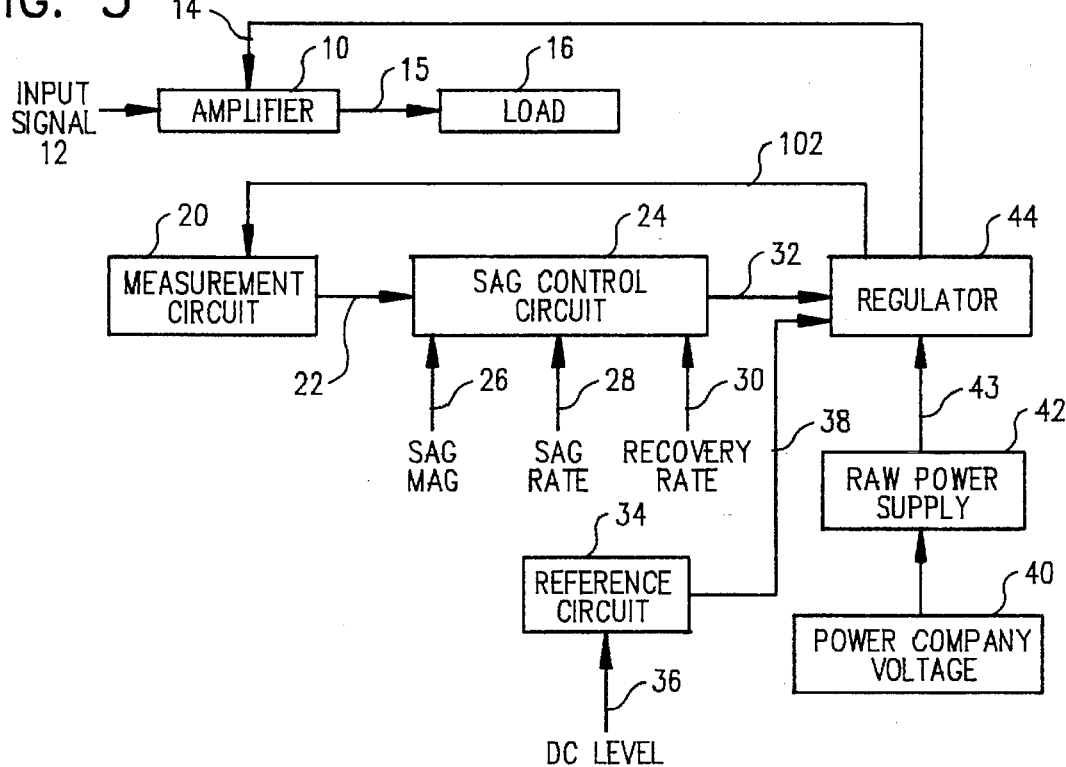
FIG. 3 is an alternative embodiment of the power supply control circuit of FIG. 1.

FIG. 3 depicts a block diagram of a third embodiment of the present invention. In this embodiment, the observed signal 102 is a current or voltage being delivered by the regulator 44 to the amplifier 10. Other than the different source of the observed signal 102, this embodiment functions in the same manner as the embodiment described in detail for FIG. 1 above.

Figure 4:
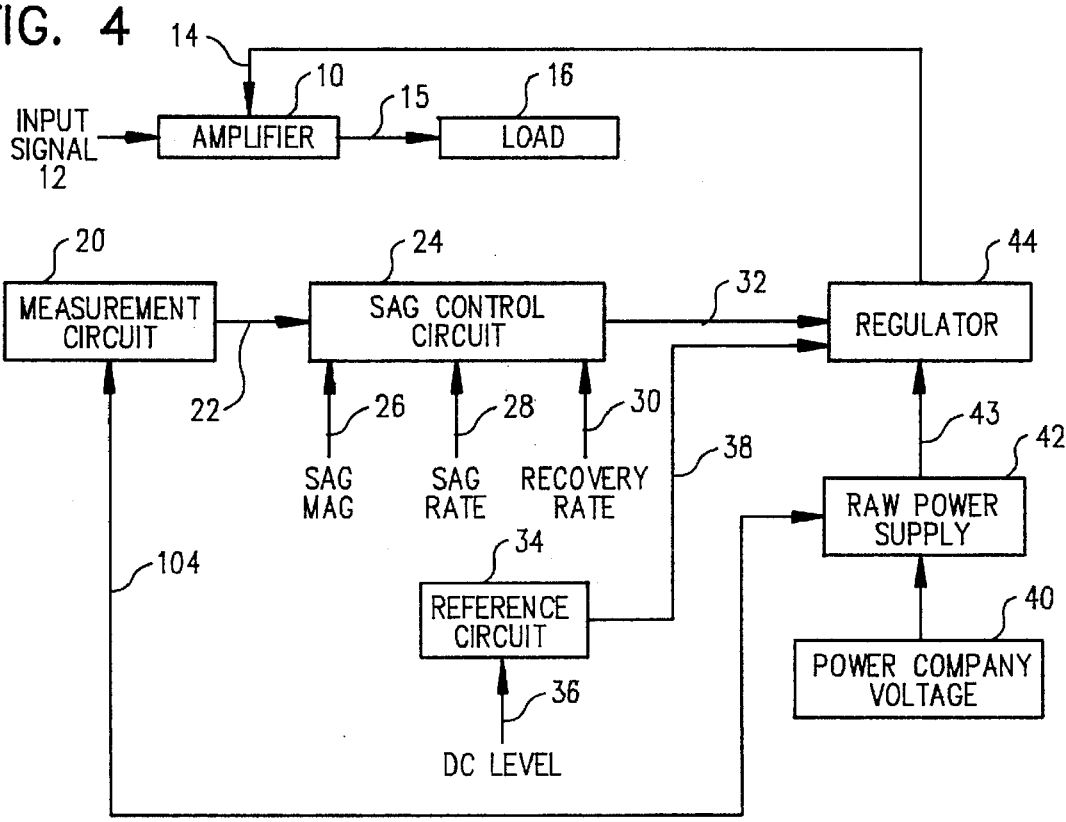
FIG. 4 is an alternative embodiment of a power supply control circuit of FIG. 1.

FIG. 4 depicts a block diagram of a fourth embodiment of the present invention. In this embodiment the observed signal 104 is a current or voltage in the raw power supply 42. Other than the different source of the observed signal 104, this embodiment functions in the same manner as the embodiment described in detail for FIG. 1 above.

FIG. 5 depicts a block diagram of a fifth embodiment of the present invention. In this embodiment, there exists a second power supply 200 that provides a second power signal 202 to a load 204. The load 204 may be completely distinct from the amplifier 10, or a separate part of the amplifier 10 that is not supplied by the regulator 44, or a second terminal on a device within the amplifier 10 that has a first terminal supplied by the regulator 44. An example of this last configuration is a pentode tube in an amplifier in which the plate of the pentode is supplied by this second power supply. The screen of the pentode is supplied by the main power supply via a regulator 44. In this embodiment, the observed signal 106 is a current or voltage in the second power supply 200. The remainder of the sag control, reference, and regulator circuits remain the same in this embodiment as in the previous embodiments as described in detail for above.

FIG. 6 depicts a block diagram of a sixth embodiment of the present invention. In this embodiment, the observed signal 108 is a current or voltage in load of the second power supply 204. Other than the different source of the observed signal 108, this embodiment functions in the same manner as the embodiment shown in FIG. 5.

The following discussion concerns circuit diagrams that illustrate specific implementations of the present invention. It is to be understood that when viewing these diagrams, there are a number of amplifiers, amplifier loads, measurement circuits, and regulator types that can be used, as will be evident to one of ordinary skill in this technology. The specific circuits shown in the following embodiments are presented to illustrate the function of the present invention, and they are not meant to be an exhaustive list of circuits to which the present invention could be applied.

FIGS. 7 and 9–11 depict four embodiments of the present invention used in conjunction with various types of amplifiers. Each of the embodiments shown in FIGS. 7 and 9–11 all operate in basically the same manner. Therefore details of the operation of the present invention in conjunction with an amplifier and amplifier load will only be discussed in reference to FIG. 7, with the understanding that the discussion also applies to the embodiments shown in FIGS. 9–11.

Figure 7:
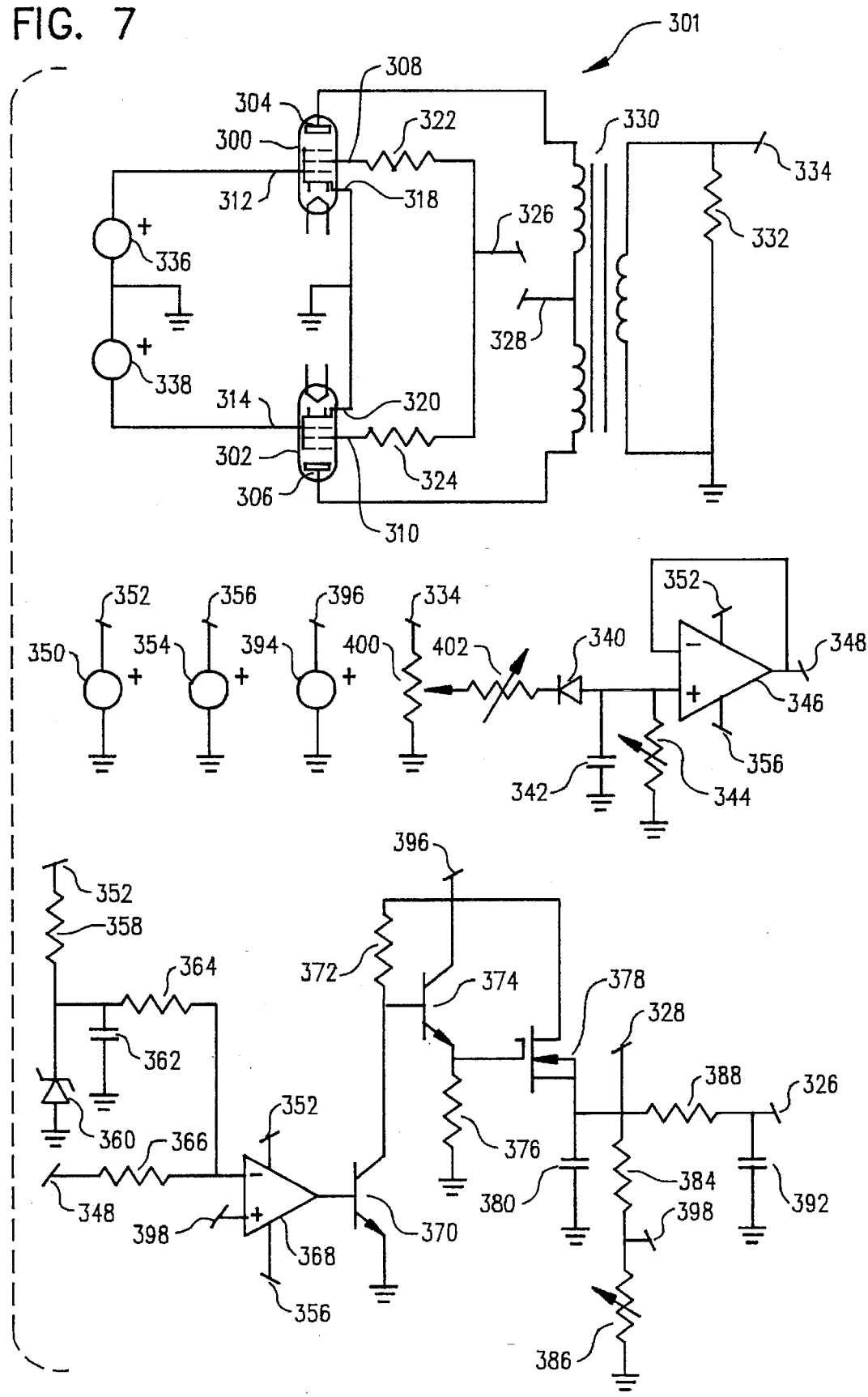
FIG. 7 is a detailed schematic diagram of a power supply control circuit formed in accordance with the present invention and in conjunction with a push-pull pentode amplifier and resistive load.

Turning next to FIG. 7, depicted therein is a circuit diagram of a representative embodiment of the present invention that essentially corresponds to the circuit set forth in the block diagram of FIG. 2. The amplifier circuit 301 shown in FIG. 7 is a push-pull type utilizing pentodes as the amplifying devices. While this type of amplifier circuit is found in the power stage of many commercially available amplifiers, the circuit of amplifier 301 may also be used in a preamplifier circuit using low power pentodes. The load of the amplifier 301 in this and all further embodiments described herein will be shown as a simple resistance. However, it is to be understood that the use of a resistive load does not imply that the present invention is only capable of functioning with amplifier loads that are simple resistances, and other types of loads may also be applied.

Referring to FIG. 7, the plates 304 and 306 of the pentodes 300 and 302 are coupled in a push pull arrangement through a center-tapped transformer 330 to a load 332. The signal inputs, signal amplification and bias circuits of a complete amplifier assembly are represented by the voltage supplies 336 and 338. The plate voltage for the pentodes 300 and 302 is connected to a center tap 328 of the transformer 330. The screen voltage for the pentodes 300 and 302 is connected to screen grids 308 and 310 via screen grid resistors 322 and 324.

In the embodiment of FIG. 7, the observed signal is the voltage across the load resistor 332. This voltage is attenuated by a potentiometer 400 which is the sag magnitude control. A diode 340 and capacitor 342 constitute a negative peak detector. In this embodiment the negative peak of the observed and attenuated voltage will be the measured signal discussed in the previous section. The function of the peak detector has been modified by the addition of a variable resistor 402, which limits the rate at which the capacitor 342 can charge. The variable resistor 402 acts as the sag rate adjustment in this embodiment of the present invention. The variable resistor 344 determines the rate at which the capacitor 342 discharges, and hence the variable resistor 344 acts as the recovery rate adjustment.

An operational amplifier 346 (which is supplied by voltage supplies 350 and 354) acts as a buffer to isolate the sag signal generation circuit from the remainder of the power supply. The output of the operational amplifier 346 is the sag signal described in the previous section.

The voltage reference circuit is comprised of a voltage supply 350, a resistor 358, a zener diode 360, and a capacitor 362. The sag signal and reference voltage are added through resistors 364 and 366 to generate the regulator tracking voltage (the voltage at the inverting terminal of the operational amplifier 368).

In this embodiment, the regulator type (components 368–386) is a linear series regulator. The output of the raw power supply is represented by a voltage source 394. The operational amplifier 368 provides the differential amplifier function required to create a feedback loop that causes the output of the regulator circuit to track the regulator tracking voltage. A transistor 370 and a resistor 372 amplify the output of the operational amplifier 368, as well as shift the DC level of the output of the operational amplifier 368 high enough to drive the regulator pass devices. A transistor 374 and resistor 376 form a buffer for driving the MOSFET pass device 378. A capacitor 380 stabilizes the output of the regulator circuit to prevent oscillations. The output of the regulator circuit is the voltage across the capacitor 380. A resistor 384 and a variable resistor 386 are used to create the regulator feedback circuit. The voltage appearing across the variable resistor 386 is connected back to the noninverting input of the operational amplifier 368, completing the feedback connection. The DC level of the regulator circuit output is set by the value of the variable resistor 386. The output of the regulator circuit is connected directly to the center tap of the transformer 330. A resistor 338 and capacitor 392 form an RC low pass filter. The output of this filter is the voltage appearing across a capacitor 392. This voltage is connected to the screen grids 308 and 310 of the pentodes 300 and 302 via two screen resistors 322 and 324.

When no input signal is present, the AC component of the voltages produced by the voltage generators 336 and 338 is zero. Consequently the voltage across the load resistor 332 is also zero. Since the load voltage is the observed signal in FIG. 7, the sag signal is also zero. Assuming that the two addition resistors 364 and 366 are equal in magnitude, then in this DC state, the regulator tracking voltage is equal to one half of the voltage across the reference zener diode 360. The purpose of the regulator circuit (components 368–386) is to ensure that the feedback voltage is equal to this regulator tracking voltage. The DC level of the regulator output is adjusted using variable resistor 386.

To illustrate how the regulator circuit is able to track the regulator tracking voltage, assume that the voltage appearing across the variable resistor 386 is higher than the regulator tracking voltage. This voltage imbalance will cause the output of the operational amplifier 368 to increase. This increase will in turn cause the transistor 370 to cause more current to flow through the resistor 372. This increase in current flow will cause the voltage appearing at the base of the transistor 374 to decrease. Since the transistor 374 is configured as a follower, this decrease in base voltage will cause a decrease in gate voltage to appear at the MOSFET 378. The MOSFET 378 is also configured as a follower, so the regulator circuit output voltage will also decrease. This decrease in the regulator circuit output voltage will decrease the voltage across variable resistor 386 until this voltage is equal to the regulator tracking voltage.

Figure 8A:
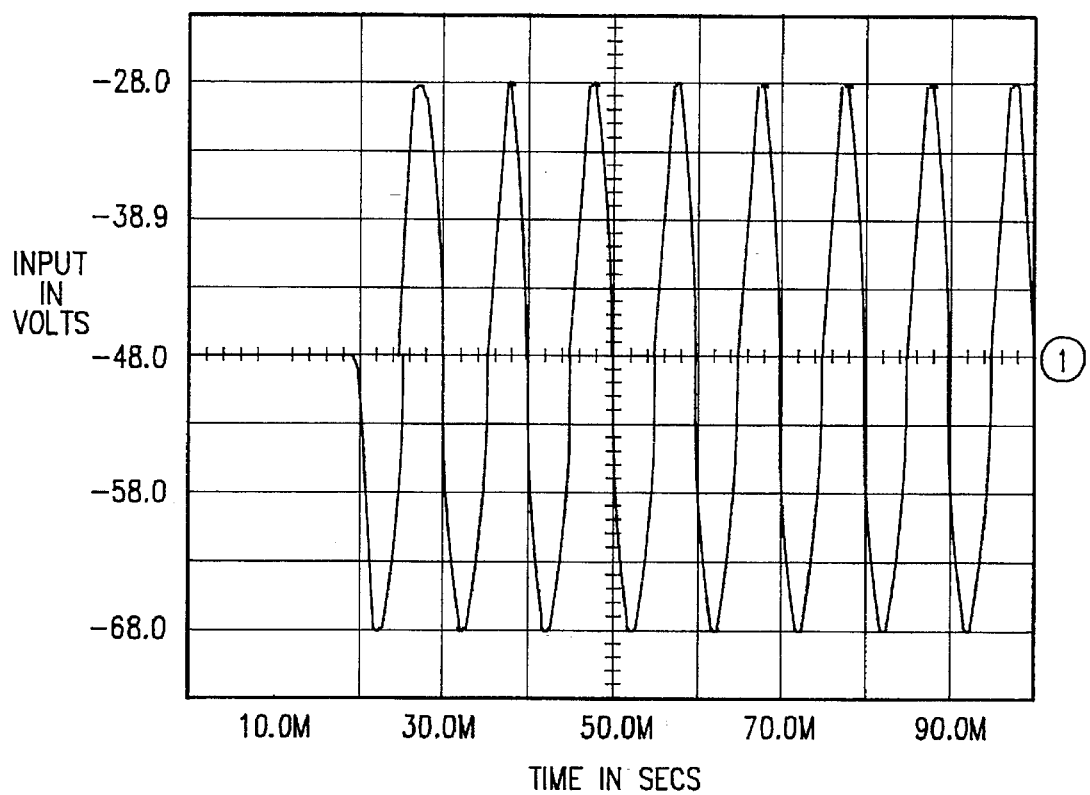
FIG. 8A depicts a sample input wave form of the power supply control circuit of FIG. 7.

The dynamic behavior of the specific embodiment shown in FIG. 7 will now be discussed. Assume that the signal input to the amplifier circuit 301 is zero for a period of time and is then a sine wave. As was mentioned previously, the signal input, preamplifier, phase splitting and bias functions of a complete amplifier are lumped into the voltages supplies 336 and 338. The signal then presented to the control grid 314 of the pentode 302 is shown in FIG. 8A. The signal presented to the control grid 312 of the pentode 314 is 180 degrees of phase with the signal shown in FIG. 8A.

The voltage appearing across the load resistor 332 will be a sine wave that is distorted somewhat by the nonlinearity of the pentodes 300 and 302. Initially, the voltage across the capacitor 342 will be zero. During the first negative excursion of the load voltage, the capacitor 342 will begin to accumulate a negative voltage. The rate that the capacitor 342 charges is dependent on the value of a variable resistor 402. In this embodiment, the observed signal (the load voltage) is a low impedance signal, therefore the impedance of a potentiometer 400 can be made much lower than the range of values of the variable resistor 402. Therefore, the potentiometer 400 determines the maximum negative value that the capacitor 342 will charge to, but the rate at which the capacitor 342 charges is basically determined by the value of the variable resistor 402.

As the load voltage begins to increase from its maximum negative value attained in this first cycle, the voltage appearing at the cathode of the diode 340 will eventually exceed the voltage across the capacitor 342. When this situation occurs, the diode 340 will turn off, effectively isolating the capacitor 342 from the load voltage, the potentiometer 400 and the variable resistor 402. The voltage stored in the capacitor 342 will then begin to discharge through variable the resistor 344 (the recovery rate control). The rate at which the capacitor 342 discharges is dependent on the value of the variable resistor 344.

Figure 8B:
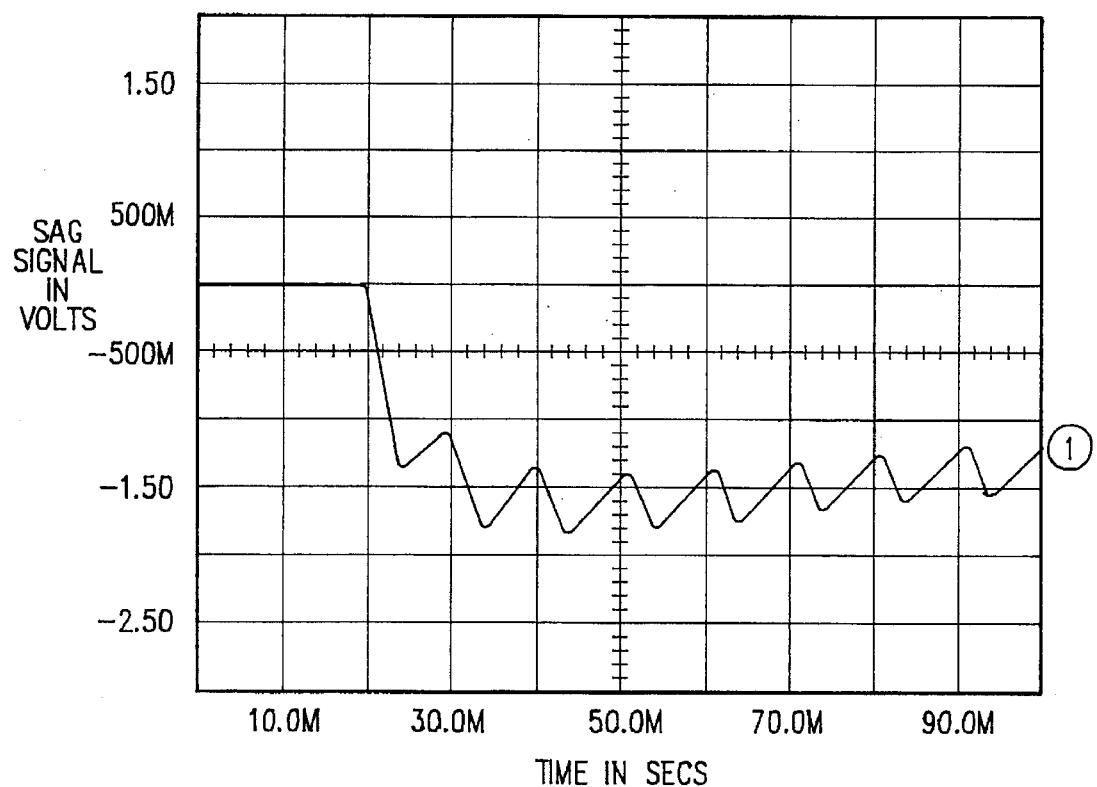
FIG. 8B depicts the sag signal generated at the output of the operational amplifier shown in FIG. 7.

Because the operational amplifier 346 is configured as a follower, the output of the operational amplifier 346 is very nearly an exact copy of the voltage appearing at the noninverting terminal of the operational amplifier 346. The signal appearing at the output of the operational amplifier 346 is the sag signal previously discussed. The sag signal is shown in FIG. 8B. Each time the input voltage moves toward its negative maximum, the sag signal also begins to decrease. The slope of the downward trending portions of the graph in FIG. 8B is determined by the value of the variable resistor 338. The maximum negative voltage attained by the sag signal is determined by potentiometer 336. The slope of the upward trending portions of the graph in FIG. 8B is determined by the value of variable resistor 344.

Figure 8C:
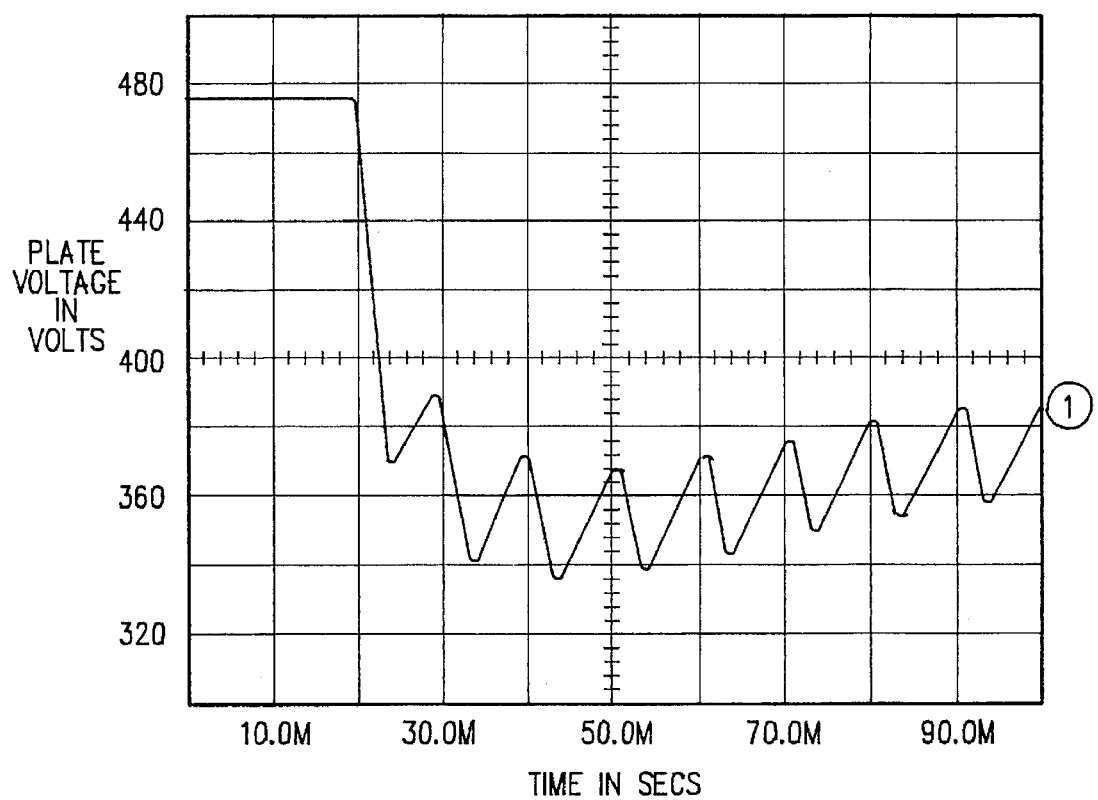
FIG. 8C depicts the output of a regulator that supplies the plate voltage to the amplifier depicted in FIG. 7.
Figure 8D:
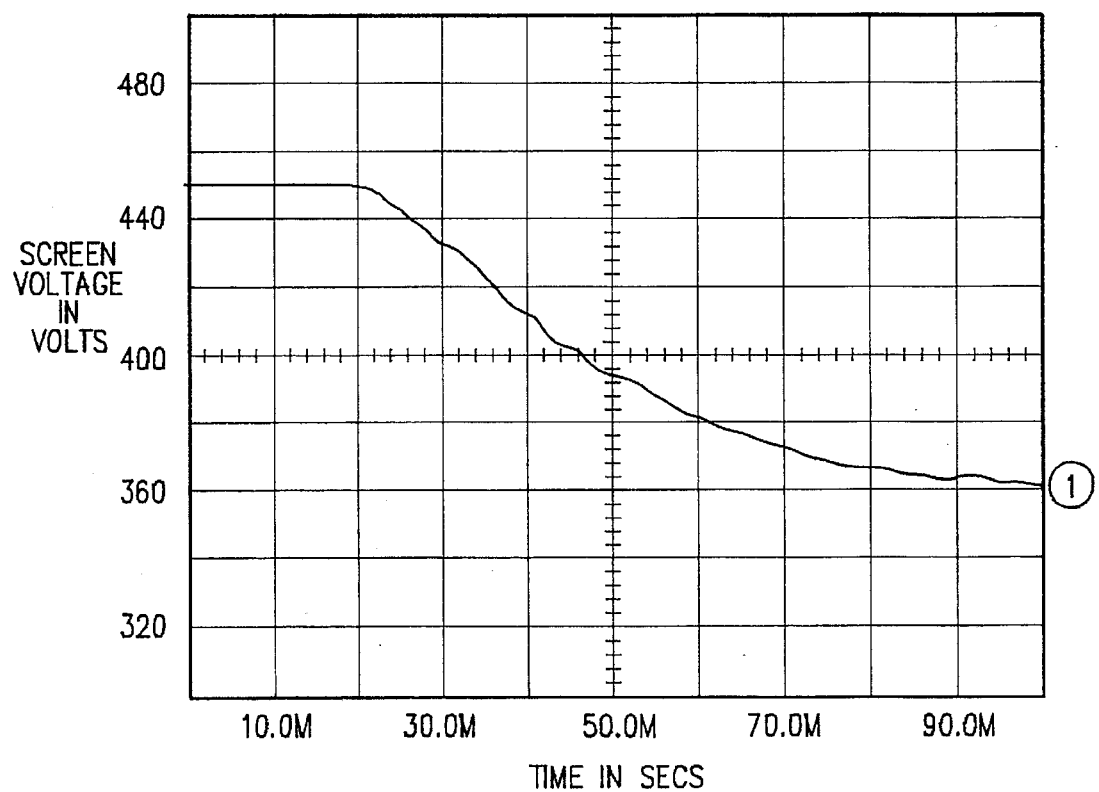
FIG. 8D depicts the screen voltage of the components shown in FIG. 7 which corresponds to the voltage across the capacitor 392.

The sag signal is added to the reference voltage through resistor 366. The regulator circuit (components 368–386) will then track the regulator tracking voltage as previously discussed. The regulator's circuit output is used as the plate voltage in the amplifier is shown in FIG. 8C. The plate voltage decreases from its DC value, directly tracking the sag signal. The screen voltage is the voltage across the capacitor 392. Since this voltage is filtered by a low pass filter made up of the resistor 388 and the capacitor 392, this voltage follows the plate voltage in its downward trend in a smoother manner.

Figure 8E:
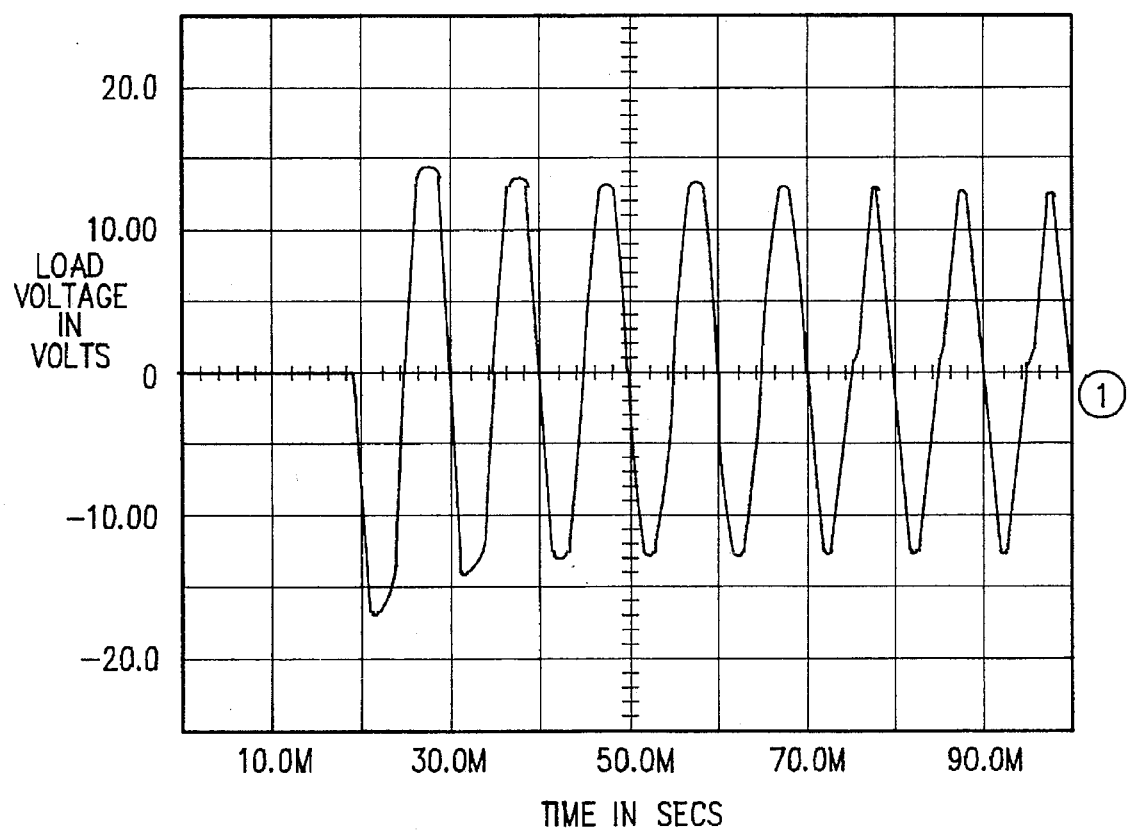
FIG. 8E depicts the clipping and compression in the output of the amplifier shown in FIG. 7 due to the input shown in FIG. 8A.

The net effect of these changes on the amplifier's operation can be seen in FIG. 8E, which is a graph of the voltage appearing across load resistor 332. As can be seen in the first few cycles, the tops of the sine waves are basically lopped off by the decrease in the plate supply voltage. As the plate and screen supply voltages continue to decrease, the peak negative and positive values of the load voltage continue to decrease until levelling off. This decrease in maximum load voltage leads to the slight decrease in the magnitude in the sag signal shown in FIG. 8B.

As can be seen from FIG. 8E, the distortion and compression caused by a power supply with apparently large dynamic resistance is clearly present.

Figure 7A:
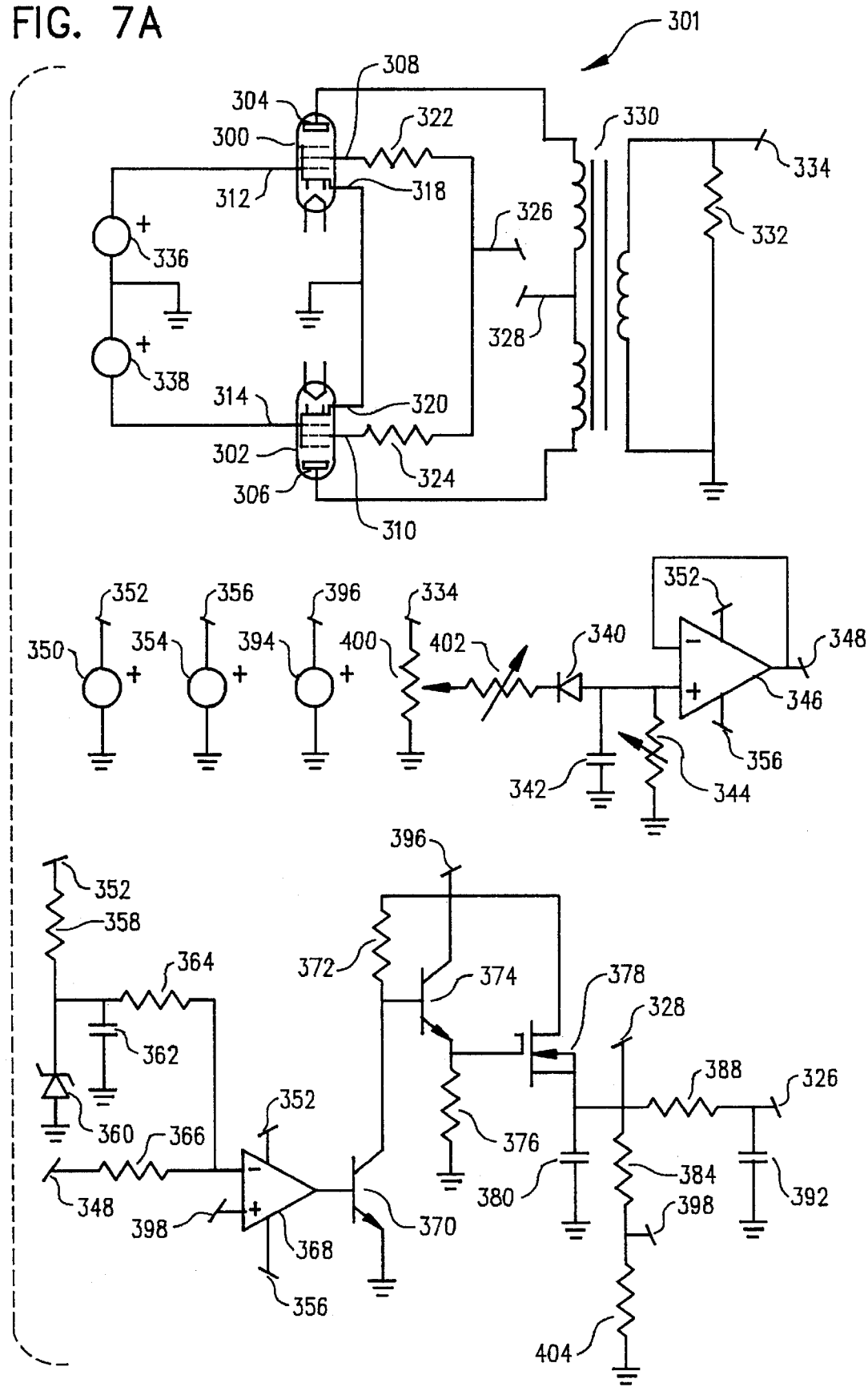
FIGS. 7A, 7B, and 7C are modified embodiments of the power supply control circuit shown in FIG. 7.
Figure 7B:
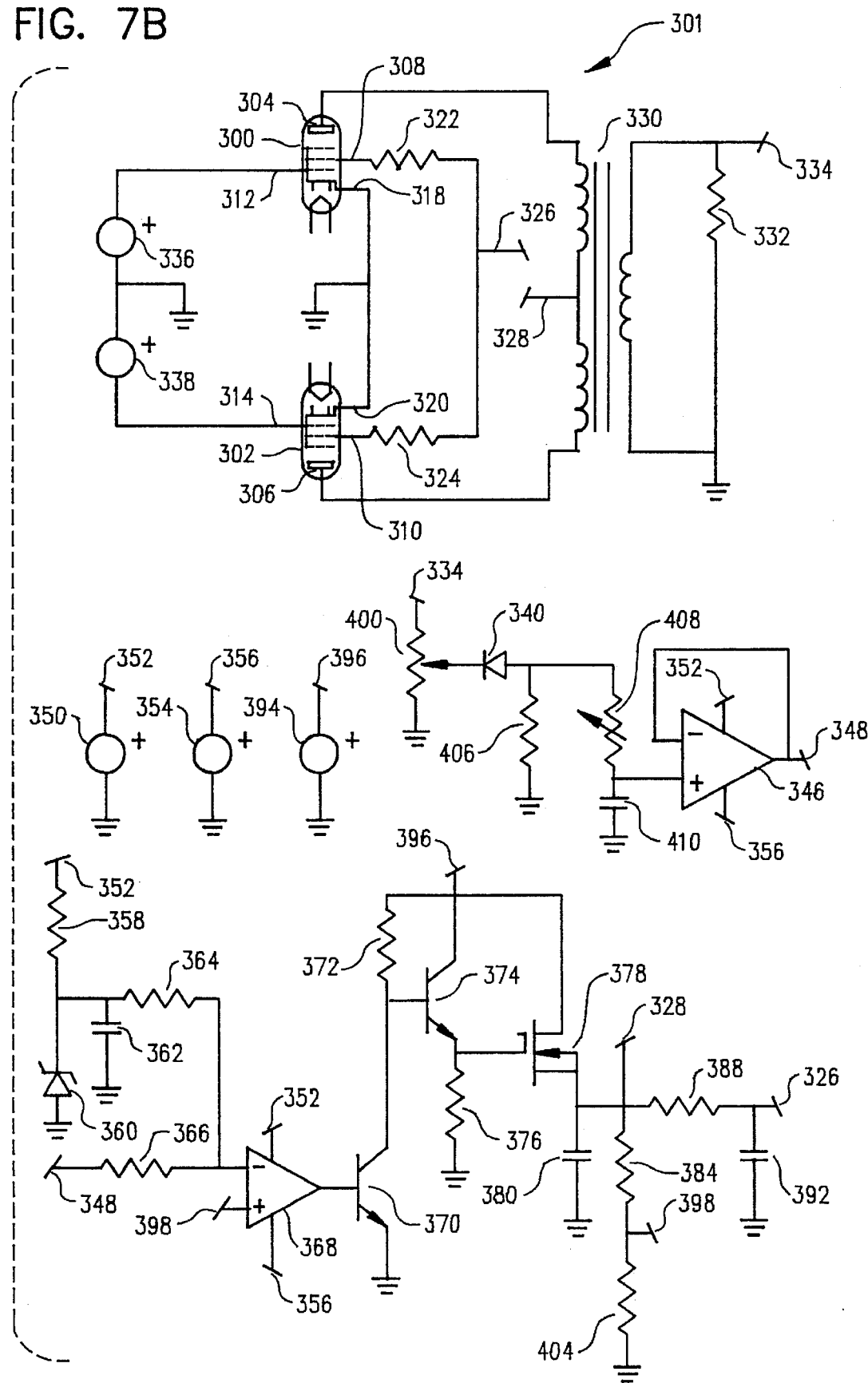
Figure 7C:
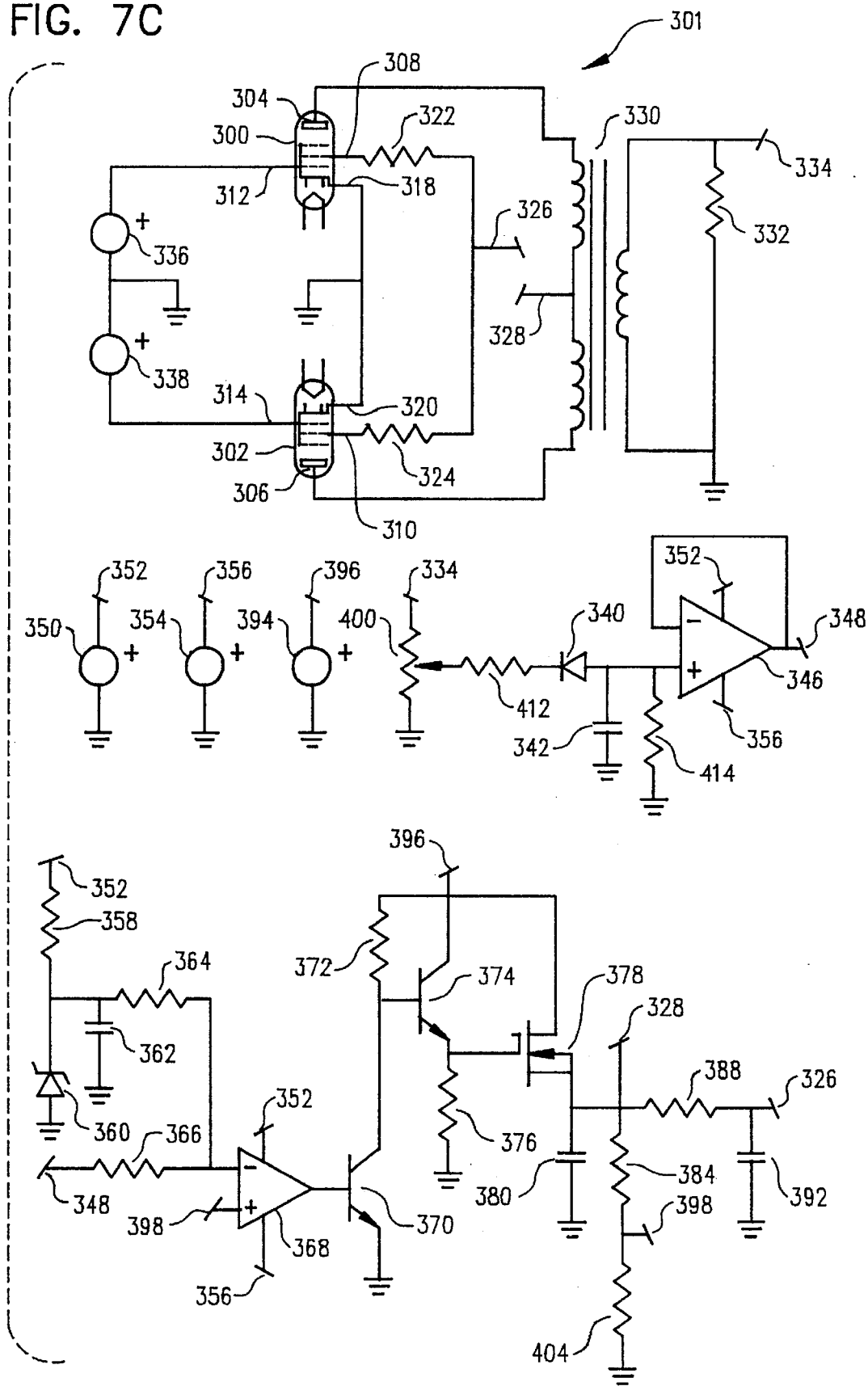

Turning next to FIGS. 7A–7C, the embodiments shown therein are "stripped-down" versions of the power supply control circuit illustrated and described above in conjunction with FIG. 7. These three embodiments retain the same numbering as FIG. 7 for simplicity, and the description above with respect to these components remains the same. For instance, in FIG. 7, the variable resistor 386 is used to adjust the DC (static) level of the output of the power supply. In FIG. 7A, the variable resistor 386 is replaced by a fixed resistor 404, thus removing the DC level adjustment capability.

In FIG. 7B, the variable resistor 386 is replaced by a resistor 404 in order to remove the DC level adjustment, as described above in conjunction with FIG. 7A. Additionally, the variable resistors 402 and 344 are removed and the capacitor 342 is removed. The variable resistors 402 and 344 are the sag rate and recovery rate controls, respectively. The capacitor 342 is used to detect the peaks of the observed signal. The function of these removed components is replaced by a resistor 406, a variable resistor 408, and a capacitor 410, as shown in FIG. 7B. With this modification, the sag rate and recovery rate controls are merged into a single rate control. Thus, when there is an output signal from across the load resistor 332, the capacitor 410 will begin to charge up to the negative peak of the signal, since the diode 340 still only allows negative voltage to pass through. The maximum voltage that will appear across the capacitor 410 is still determined by the sag magnitude potentiometer 400. The rate at which the capacitor 410 can charge (which is the sag rate) is dependent on the value of the variable resistor 408. When the amplifier signal decreases or is removed, the capacitor 410 discharges through the variable resistor 408 and the fixed resistor 406 to the ground. Therefore, the rate of discharge (which is the recovery rate) is also dependent on the value of the variable resistor 408.

In FIG. 7C, the variable resistor 386 is replaced by a resistor 404 in order to remove the DC level adjustment as described above in conjunction with FIG. 7A. Additionally, the variable resistors 402 and 344 are replaced by fixed resistors 412 and 414. This replacement means that the sag rate and recovery rate are no longer controllable by the musician. The only remaining control in FIG. 7C is the sag magnitude (potentiometer 400).

Figure 9:
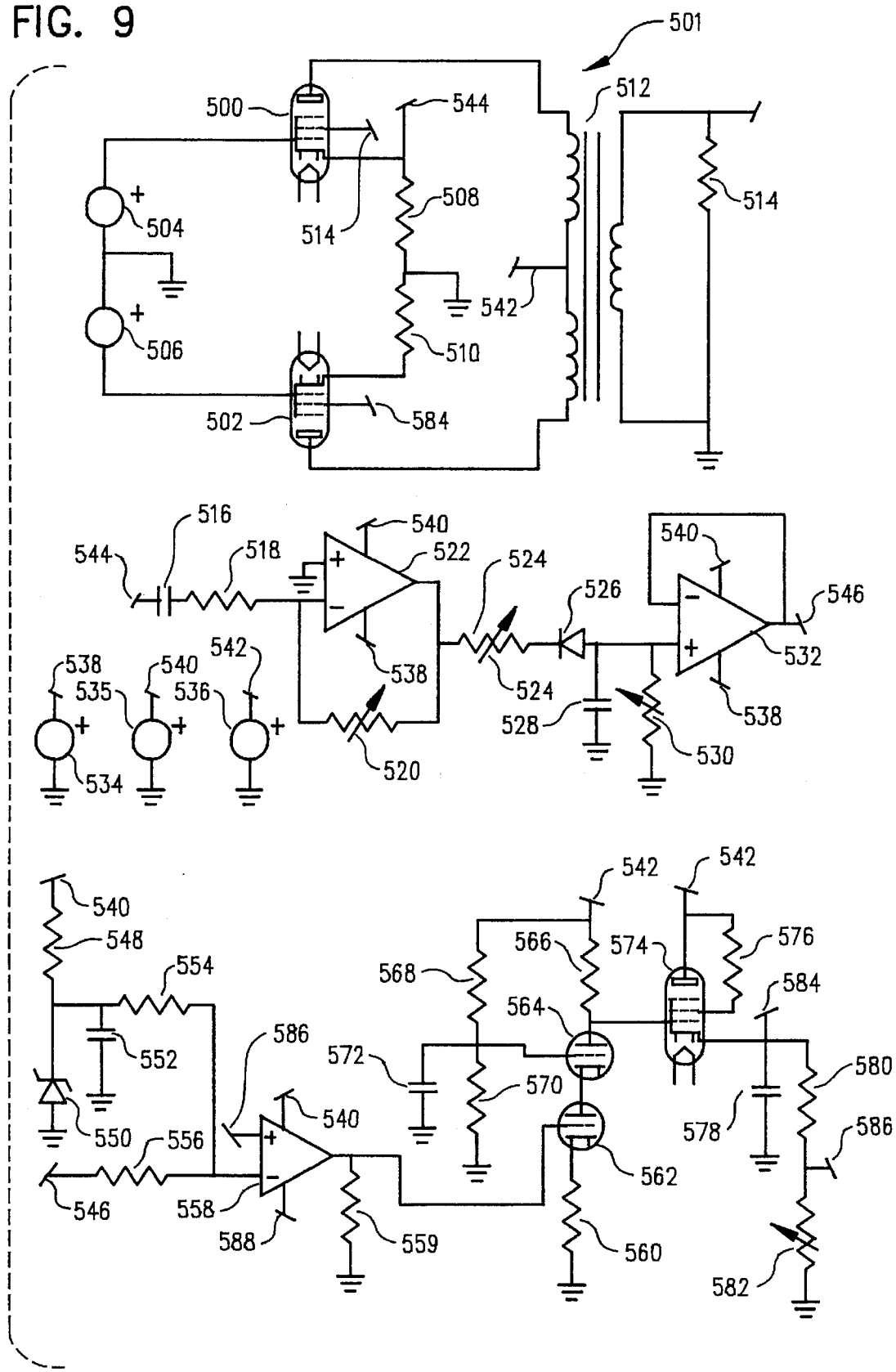
FIG. 9 is a detailed schematic diagram of an alternative embodiment of a power supply control circuit formed in accordance with the present invention and used in conjunction with a push-pull pentode amplifier and resistive load, where the measured signal is the current through one of the pentodes.

FIG. 9 depicts a revised embodiment of the foregoing. In this embodiment, the amplifier 501 is a push-pull pentode type as in the previous embodiment. However, the plate supply used with this amplifier is the output of the raw supply represented by the voltage source 536. Only the screen supplies are regulated. The output observed signal in this example is the cathode current of the pentode 500. This current is dominated by the current coming from the plate of the pentode 500. The value of this current is determined by causing the current to pass through the cathode resistor 508 and then observing the voltage drop across this resistor 508.

Generally, pentodes used in a push-pull amplifier are biased to operate in a class A or class AB manner. Therefore, there is a DC current flowing through the pentodes, which generates a DC voltage across the cathode capacitor 508. Since the purpose of the sag signal generation circuit is to produce a voltage that is directly dependent on signal current, the DC voltage present in the observed signal must be removed. This removal is accomplished by the coupling capacitor 516.

Since the voltage across the cathode resistor 508 is generally small, a simple attenuator cannot be used as the sag magnitude control (as in the previous embodiment). Therefore, the sag magnitude control is implemented using the amplifier 501, which comprises the resistor 518, the operational amplifier 522, the operational amplifier 532, and the variable resistor 520. The sag magnitude control itself is accomplished with the variable resistor 520. The remainder of the sag signal generation circuit as well as the reference voltage circuit (components 524–556) is the same as in the embodiment described in FIG. 7.

Since only the screen grids of the pentodes 500 and 502 are being supplied by the regulated supply, and screen grids generally do not require high amounts of current, the triode connected pentode 574 can be used as the pass device in the regulator circuit (the voltage amplification and level shifting functions within the regulator are accomplished by components 560–572). The regulator circuit output is the voltage across the capacitor 578. The DC level of the regulator's output is determined by the variable resistor 582.

Figure 10:
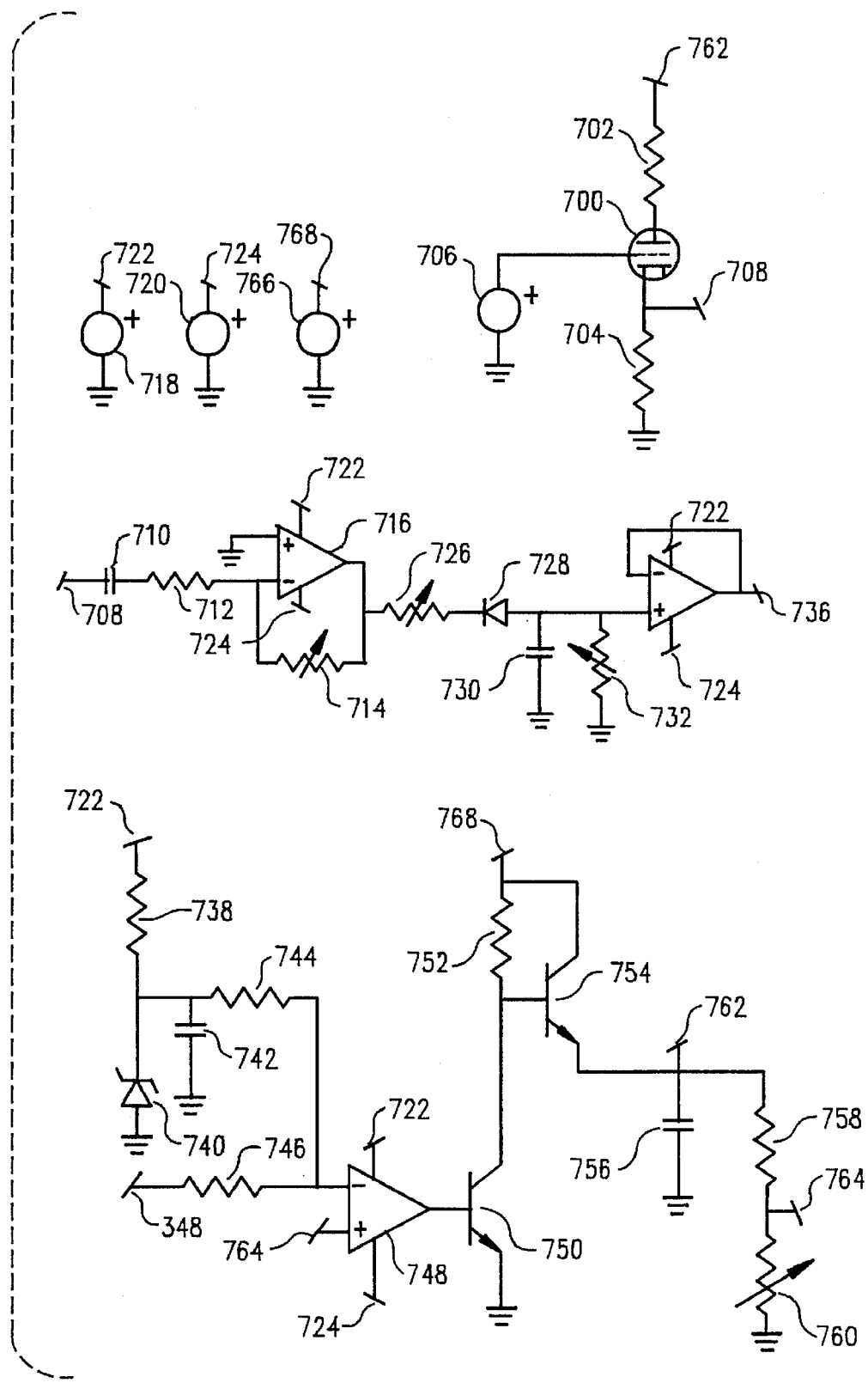
FIG. 10 is a detailed schematic diagram of an alternative embodiment of a power supply control circuit formed in accordance with the present invention and used in conjunction with a single-ended triode amplifier and resistive load and wherein the measured signal is the current through the triode.
Figure 11A:
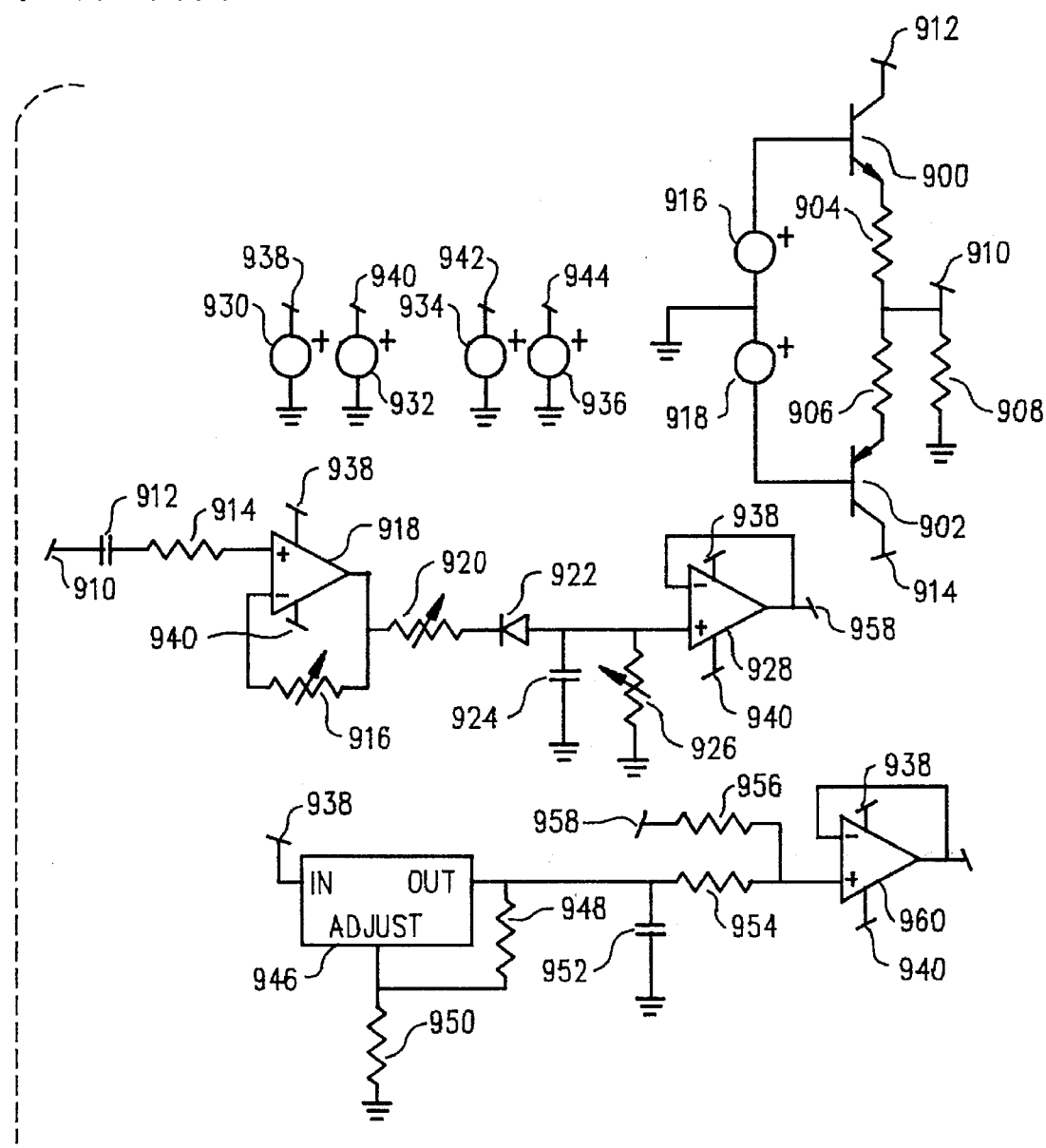
FIGS. 11A and 11B are detailed schematic diagrams of an alternative embodiment of a power supply control circuit formed in accordance with the present invention and used in conjunction with a complimentary transistor amplifier and resistive load wherein the measured signal is the load voltage.
Figure 11B:
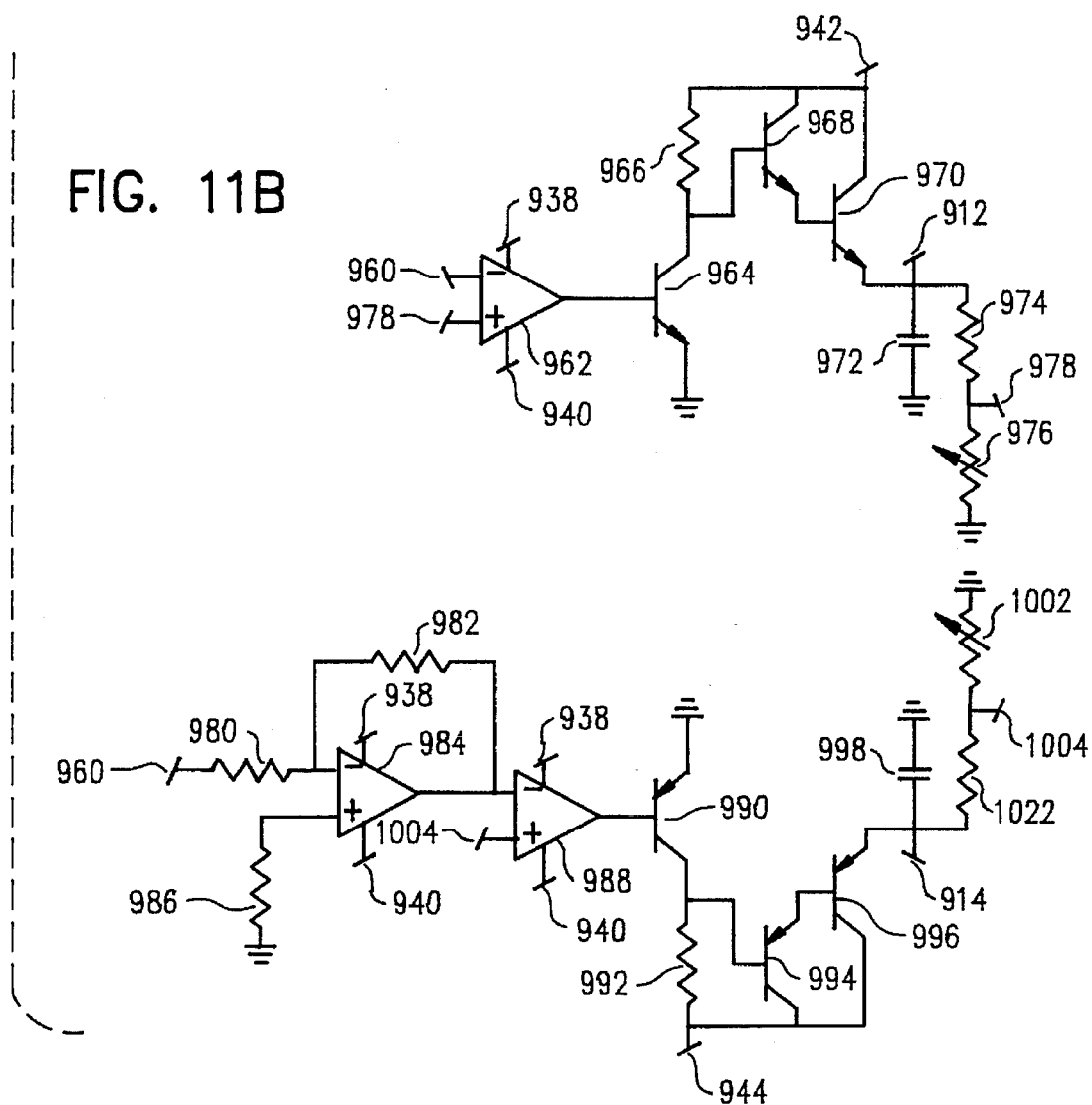

FIG. 10 depicts yet another embodiment of the present invention. In this embodiment, the amplifier circuit 701 uses a triode 700 or triode-connected pentode with a load resistor 702. This amplifier circuit 701 could be a stage within a larger amplifier, or the output stage of a single ended transformer coupled amplifier where the transformer and load resistance are modelled by the simple resistor 702.

The observed signal in this embodiment is the cathode current passing through the triode 700. This current is determined by observing the voltage across the cathode resistor 704. As in the embodiment described above in conjunction with FIG. 9, the voltage across this cathode resistor may contain a DC component and is relatively small. Therefore, as in the FIG. 9 embodiment, the coupling capacitor 710 and the amplifier circuit, which comprises components 712–716, are used at the front of the familiar sag signal circuit which is comprised of components 726–734.

In this embodiment, the transistor 754 is used as a pass element in the regulator circuit. Since the triode 700 generally does not conduct a large amount of current, a current boosting transistor used in the first embodiment set forth in FIG. 7 is not required.

In this embodiment, the sag magnitude control is a variable resistor 714, the sag rate control is a variable resistor 726, the recovery rate control is a variable resistor 732, and the DC level control is a variable resistor 760.

Figure 11:
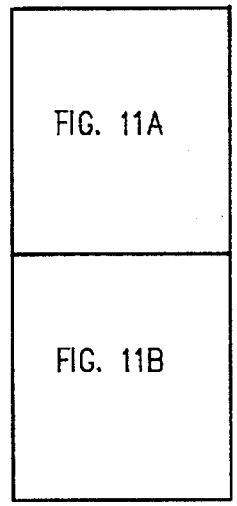
FIG. 11 shows the relationship between FIGS. 11A and 11B.

FIG. 11 depicts still yet another embodiment of the present invention. The amplifier used herein is a complementary transistor amplifier requiring both positive and negative voltage supplies. The observed signal in this embodiment is the voltage across a load resistor 908. The observed signal is processed by the sag signal circuit to generate the sag signal appearing at the output of operational amplifier 928. This sag signal circuit (consisting of components 912–928) is the same type of circuit that was used in the previous two embodiments.

The reference voltage in this embodiment is generated by the voltage regulator circuit consisting of a voltage regulator 946, resistors 948 and 950, and a capacitor 952. The voltage regulator 946 can be any number of commercially available voltage regulators, for example an LM317. The reference voltage and sag signal are added together via the two resistors 954 and 956 to produce the regulator tracking voltage appearing at the output of the operational amplifier 960. The positive power supply required by the amplifier is obtained from the positive voltage regulator consisting of components 962–976. This voltage regulator is similar to the voltage regulator used in the first embodiment, except that the pass device 970 is a BJT instead of a MOSFET.

The regulator tracking voltage used by a positive regulator must be modified before it can be used with the negative regulator. The proper function of the negative regulator is to maintain a constant, negative output voltage that decreases in magnitude in response to the sag signal. To obtain the proper tracking signal, the regulator tracking signal that appears at the output of an operational amplifier 960 is simply inverted by the circuit consisting of operational amplifier 984 and resistors 980 and 982. The negative regulator, which is constructed of components 988–1002, is then just a complementary version of the positive regulator. Since both regulators are tracking the same sag signal, the outputs of each regulator will sag in a symmetrical, balanced manner.

While various preferred embodiments of the invention have been described above, it is to be understood that various changes may be made therein without departing from the spirit and scope of the invention as set forth in the appended claims. For example, the regulator used does not have to be a series type, it could be of a shunt, switching, ferroresonant or any other type. The reference voltage can also be generated in a number of different ways besides those presented here, including vacuum tube references, band gap references or even batteries. The amplifiers used in the preferred embodiments above show that any of the vast numbers of amplifiers in existence can be used in conjunction with a power supply that incorporates the principles of the present invention.

The sag signal generation circuit described herein is basically a peak detection circuit. The reason this circuit is used is because the behavior of this circuit most closely resembles the sag produced by an unregulated power supply with high power supply resistance. However, the use of this circuit does not imply that this design is the only circuit which can be used for this function. The sag signal circuit shown could easily be changed to a circuit that tracks the average of the observed signal by passing the observed signal through a low pass filter before being applied to a sag signal generation circuit. Similarly, the sag signal circuit could be changed to a circuit that tracks the RMS value of the observed signal by passing the observed signal through an RMS to DC converter (an example of which is the AD637). The output of the RMS converter would then be applied to the sag signal generating circuit. Finally, the present invention is not limited to just amplifiers. It may be used in welding machines, and in conjunction with prepamps as well as power amplifiers. Consequently, the invention is to be limited only by the scope of the appended claims.

The embodiments of the invention in which an exclusive property or privilege is claimed are defined as follows:

1. An electronic power supply control circuit for an electronic circuit having an amplifier and at least one power supply, the amplifier being adapted to receive a raw power supply current from the power supply and an input signal from an input signal source, and to supply a corresponding amplified output signal to a load, the control circuit comprising:

a measuring circuit for measuring an observed signal and generating a measured signal in response thereto;

a sag control circuit for receiving said measured signal and generating a sag control signal in response to said measured signal;

a reference circuit for generating a static reference signal; and means for regulating the power supply, said regulating means receiving said sag control signal, said reference signal, and a power supply current from the power supply, and generating a regulated power supply current for the amplifier in response to said sag control signal and said reference signal, whereby as the sag control signal increases, said regulating means decreases the maximum power available to the amplifier, thereby producing increased distortion and compression in the output signal.

2. The control circuit of claim 1, wherein said sag control circuit includes means for adjustably controlling the maximum value of said sag control signal.

3. The control circuit of claim 1, further including means for controlling the rate of change of said sag control signal as said sag control increases and decreases in response to said measured signal.

4. The control circuit of claim 1, wherein said reference circuit includes means for enabling user adjustment in the magnitude of said static reference signal.

5. The control circuit of claim 1, wherein said observed signal is the output signal from the amplifier.

6. The control circuit of claim 1, wherein said observed signal is said regulated power supply current received in the amplifier.

7. The control circuit of claim 1, wherein said observed signal is the raw power supply current generated by the power supply.

8. The control circuit of claim 1, wherein said observed signal is a second power supply current generated by a second power supply for a second load in the electronic amplifier circuit.

9. The control circuit of claim 1, wherein said observed signal is a second load signal generated by a second load that is powered by a second power supply in the power amplifier circuit.

10. A method for controlling an electronic power supply in an electronic amplifier circuit having an amplifier and at least one power supply, the amplifier being adapted to receive a power signal from at least one power supply and an input signal from an input signal source, and to generate an amplified output signal, the method comprising the steps of:

monitoring an observed signal in the electronic amplifier circuit and generating a measured signal in response thereto;

generating a sag control signal in response to the measured signal;

generating a static reference signal; and regulating the power supply signal in response to the sag control signal and the static reference signal such that as the sag control signal increases, the maximum power available to the amplifier decreases, thereby producing increased distortion and compression in the output signal.

11. The method of claim 10, wherein the step of generating a static reference signal includes monitoring a direct current signal upon which the static reference signal is based.

12. The method of claim 10, wherein said step of generating a sag control signal further includes adjustably controlling the maximum magnitude of the sag control signal.

13. The method of claim 10, wherein said step of generating a sag control signal further includes control of the rate of change of the sag control signal as the sag control signal increases and decreases in response to the measured signal.

14. The method of claim 10, wherein said step of monitoring an observed signal comprises monitoring the output signal from the amplifier and generating a measured signal in response thereto.

15. The method of claim 10, wherein said step of monitoring an observed signal comprises monitoring the regulated power supply current delivered to the amplifier.

16. The method of claim 10, wherein said step of monitoring an observed signal comprises monitoring a raw power current signal generated by the power supply.

17. The method of claim 10, wherein said step of monitoring an observed signal comprises monitoring a second power supply current generated by a second power supply for a second load in the power amplifier circuit.

18. The method of claim 10, wherein said step of monitoring an observed signal comprises monitoring a second load signal generated by a second load that is powered by a second power supply in the power amplifier circuit.

* * * * *